US005990756A

United States Patent [19]

[11] Patent Number: 5,990,756

France, Jr. et al.

[45] Date of Patent: Nov. 23, 1999

[54] FERRITE BEAD FOR CABLE INSTALLATIONS HAVING ONE PIECE ENCASEMENT

[75] Inventors: Robert Charles France, Jr.; Robert Kelly McClellan, both of Phoenix; John Raymond Gertie, Mesa, all of Ariz.

[73] Assignee: Belden Communications Company, Wilmington, Del.

[21] Appl. No.: 08/908,473

[22] Filed: Aug. 6, 1997

[51] Int. Cl.[6] ........ H03H 2/00

[52] U.S. Cl. ........ 333/12; 336/92; 336/175; 174/121 A

[58] Field of Search ........ 333/12, 81 A, 333/181; 336/92, 175, 176; 174/121 A

[56] References Cited

U.S. PATENT DOCUMENTS

| | | | |
|---|---|---|---|
| 4,818,957 | 4/1989 | Cort | 333/12 |
| 4,825,185 | 4/1989 | Matsui | 333/12 X |
| 4,882,561 | 11/1989 | Fujioka | 336/65 |
| 4,885,555 | 12/1989 | Palmer | 333/12 |
| 4,964,013 | 10/1990 | Kitagawa | 333/81 A X |
| 4,970,476 | 11/1990 | Kitagawa | 333/12 |
| 4,972,167 | 11/1990 | Fujioka | 336/92 |
| 4,983,932 | 1/1991 | Kitagawa | 333/12 |
| 5,003,278 | 3/1991 | May | 336/92 |
| 5,162,772 | 11/1992 | May | 336/92 |
| 5,200,730 | 4/1993 | Masuda et al. | 333/12 X |
| 5,287,074 | 2/1994 | Meguro et al. | 333/12 |
| 5,291,172 | 3/1994 | Ito et al. | 336/65 |
| 5,334,955 | 8/1994 | Strnad | 333/12 |
| 5,343,184 | 8/1994 | Matsui et al. | 336/92 |
| 5,346,410 | 9/1994 | Moore, Jr. | 439/607 |
| 5,355,109 | 10/1994 | Yamazaki | 336/92 |
| 5,373,277 | 12/1994 | Naito | 333/12 X |
| 5,486,803 | 1/1996 | Igarashi et al. | 336/92 |

FOREIGN PATENT DOCUMENTS

| | | | |
|---|---|---|---|
| 43194 | 12/1979 | Japan | 174/121 A |
| 190017 | 7/1990 | Japan | 333/12 |

*Primary Examiner*—Benny Lee
*Attorney, Agent, or Firm*—Snell & Willmer

[57] ABSTRACT

An apparatus for reducing electromagnetic interference associated with a signal-conducting cable includes a ferrite bead and a one-piece molded encasement covering the ferrite bead. The encasement includes a number of ribs located within a longitudinal aperture of the ferrite bead. The ribs protrude radially inward to secure the apparatus to the cable and to coaxially align the cable within the aperture. In a preferred embodiment, the encasement and ribs are integrally formed from a resilient material.

18 Claims, 1 Drawing Sheet

FERRITE BEAD FOR CABLE INSTALLATIONS HAVING ONE PIECE ENCASEMENT

FIELD OF THE INVENTION

The present invention generally relates to ferrite beads utilized to reduce electromagnetic interference in cables. More particularly, the present invention relates to an improved ferrite bead construction that is economical and easy to install, adjust, and remove from a cable.

BACKGROUND OF THE INVENTION

Ferrite beads are well known in the cabling industry, and are often used to shield sensitive data cables from extraneous electromagnetic noise and interference that may be present in the operating environment. A typical commercial ferrite bead may be available as a toroidal or donut shaped element sized to receive a cable. Ferrite beads may either be a solid, one-piece element or a split, two-piece assembly. The prior art is replete with devices and components designed to couple a ferrite bead to a cable. For example, a number of ferrite bead constructions and securing devices for ferrite beads are disclosed in the following patents: Meguro et al., U.S. Pat. No. 5,287,074, issued Feb. 15, 1994; May, U.S. Pat. No. 5,162,772, issued Nov. 10, 1992; and Cort, U.S. Pat. No. 4,818,957, issued Apr. 4, 1989. Although these and other prior art assemblies may adequately secure ferrite beads to cables, they may not be desirable to use in many practical applications.

The assembly disclosed by Meguro et al. includes a hinged shell that snaps around the ferrite bead to secure the ferrite bead to the cable. Such a construction is relatively expensive to manufacture and package, and the hinged portion of the shell may lack a sufficient amount of structural integrity. Furthermore, the ferrite bead or the shell may become lost during handling or installation because the ferrite bead is not attached to the shell. In addition, nothing prevents the ferrite bead from vibrating or rattling within the shell after it is installed upon the cable. Such movement of the ferrite bead may cause undesirable chafing of the cable insulation.

The prior art also includes ferrite bead assemblies that are intended to permanently affix the ferrite beads to the associated cables. For example, May discloses a device that snaps over the cable in a locking manner to prevent removal of the ferrite bead from the cable. As disclosed by May, the ferrite bead cannot be removed or adjusted without destroying the outer case that holds the ferrite bead. Thus, such prior art devices are limited to a single use and their lack of adjustability may add a significant amount to the cost of installing a large number of ferrite beads in, e.g., a complex communications system.

Cort discloses an alternate ferrite bead assembly that includes a resilient sleeve that slides onto the cable. After the sleeve is installed on the cable, the ferrite bead is pressed over the sleeve and maintained on the sleeve with two integral retaining ridges. The ferrite bead remains exposed after it is installed on the cable; the Cort device does not protect the ferrite bead from damage, nor does it protect the surrounding equipment and environment from damage caused by the ferrite bead.

Other prior art methods of securing ferrite beads to cables may also be undesirable for many applications. For example, a ferrite bead may be secured to a cable with shrink wrap tubing that covers the bead and a portion of the surrounding cable. Unfortunately, the shrink wrap material can be expensive, particularly when relatively thick ferrite beads are utilized (because the cost of shrink wrap tubing increases as the shrink-down ratio increases). For example, the material and labor cost to install a ferrite bead on a cable using a three inch section of high-shrink-ratio tubing can be $3.00 or more. In addition to its high cost, this procedure results in a relatively permanent installation. Consequently, removal or adjustment of the ferrite bead typically requires a good amount of labor and additional cost.

The use of over-molding or tie wraps to secure a ferrite bead to a cable may not be appropriate for the same reasons discussed above. For example, over-molding is a costly procedure that results in a relatively permanent installation of the ferrite bead. Removal requires additional labor to remove the bead and remold the bead in a new location upon the cable. The use of tie wraps, while relatively inexpensive and easy to install, also does not facilitate quick and easy adjustment and removal of the ferrite bead. In addition, the use of tie wraps merely secures the location of the bead on the cable; the cable is not protected from chafing by the bead and the bead remains exposed to the environment.

Accordingly, a ferrite bead assembly is needed that overcomes the above and other shortcomings of the prior art.

SUMMARY OF THE INVENTION

It is an advantage of the present invention that it provides an improved ferrite bead apparatus for reducing electromagnetic interference associated with a cable.

Another advantage is that the ferrite bead apparatus includes a ferrite bead encasement that is coupled to the ferrite bead to form a one-piece assembly.

Another advantage of the present invention is that it provides a ferrite bead apparatus that is inexpensive to manufacture and easy to install.

A further advantage is that the ferrite bead apparatus can be quickly and easily adjusted, removed, or reinstalled upon a cable without damaging the cable or the ferrite bead apparatus itself.

Another advantage of the present invention is that the ferrite bead apparatus includes a molded encasement that protects the outer surface of the ferrite bead.

The above and additional advantages of the present invention may be carried out in one form by an apparatus for reducing electromagnetic interference associated with a signal-conducting cable. The apparatus preferably includes a ferrite bead configured to surround a portion of the cable and a one-piece encasement coupled to the ferrite bead, where the encasement substantially covers an outer surface of the ferrite bead.

BRIEF DESCRIPTION OF THE FIGURES

A more complete understanding of the present invention may be derived by referring to the detailed description and claims when considered in connection with the Figures, where like reference numbers refer to similar elements throughout the Figures, and:

DETAILED DESCRIPTION OF THE PREFERRED EMBODIMENT

Figure 1:
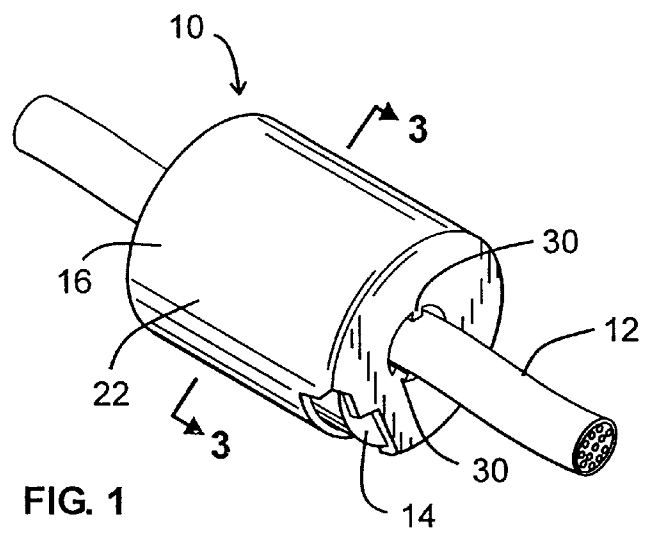
FIG. 1 is a perspective cut-away view of a ferrite bead construction installed upon a cable.
Figure 3:
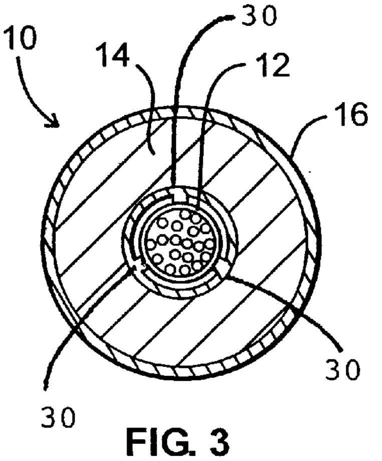
FIG. 3 is a cross sectional view of the ferrite bead construction and cable as viewed from line 3—3 in FIG. 1.
Figure 4:
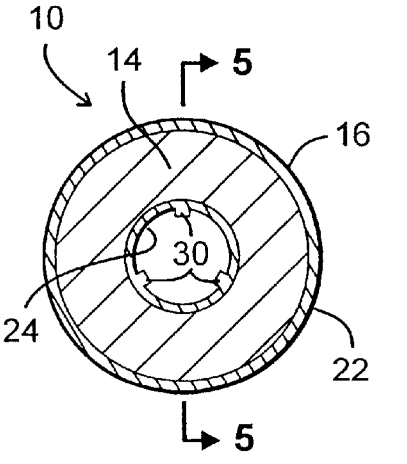
FIG. 4 is a cross sectional view of the ferrite bead construction without the cable.
Figure 5:
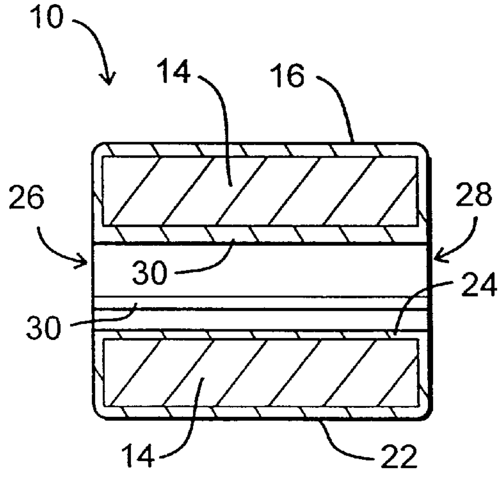
FIG. 5 is a cross sectional view of the ferrite bead construction as viewed from line 5—5 in FIG. 4.

FIGS. 1 and 3 illustrate a typical installation of a ferrite bead apparatus 10 upon an exemplary cable, e.g., a cable 12 having a plurality of twisted pair conductors, and FIGS. 4–5 are two cross sectional views of apparatus 10. Apparatus 10 is suitably configured to reduce electromagnetic interference associated with cable 12 in accordance with known theories. Generally, apparatus 10 includes a ferrite bead 14 and an encasement 16 coupled to ferrite bead 14.

Ferrite bead 14 may be formed in accordance with known techniques and may be commercially available in a variety of shapes and sizes. A preferred embodiment utilizes cylindrical or toroidal beads that exhibit satisfactory electrical characteristics while having a relatively small volume. Ferrite bead 14 preferably includes a longitudinal aperture 18 (see FIG. 2) formed therein for receiving cable 12. Consequently, ferrite bead 14 suitably surrounds at least a portion of cable 12 when apparatus 10 is installed on cable 12.

Figure 2:
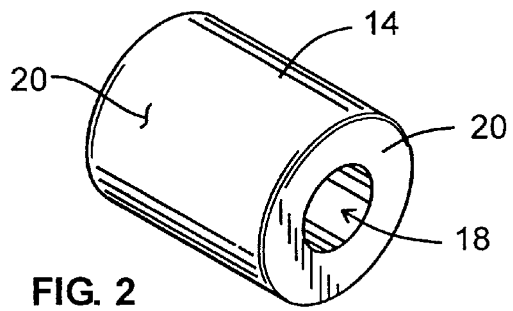
FIG. 2 is a perspective view of an exemplary ferrite bead employed by the present invention.

Encasement 16 is preferably formed as a one-piece molding that substantially surrounds and covers an outer surface 20 (see FIG. 2) of ferrite bead 14. As shown in FIG. 2, in the context of this description, outer surface 20 means the outer cylindrical surface and the two "end" surfaces of ferrite bead 14. Those skilled in the art will recognize that outer surface 20 may be exposed to the environment in many prior art installations that do not employ a protective material or cover for ferrite bead 14. Encasement 16 is preferably formed from a resilient or elastomeric material to facilitate adequate installation of apparatus 10 upon cable 12 and to provide a protective layer between ferrite bead 14 and any equipment that may be present in the surrounding environment. The particular material utilized by encasement 16 may also depend upon the electrical requirements of the specific application, environmental concerns, and/or safety regulations associated with the operating environment. For example, encasement 16 may be formed from a substantially burn-resistant material such as low-smoke PVC, a fluorinated ethylene propylene (FEP) compound, a foamed thermoplastic halogenated polymer, or the like. Such burn resistance may be desirable for plenum applications that are associated with rigorous UL burn tests or other applications that require burn or flame resistance.

In the preferred embodiment, encasement 16 is formed around ferrite bead 14 by conventional injection molding techniques. Of course, those skilled in the art will appreciate that any number of alternate application techniques can be equivalently employed to apply encasement 16 to ferrite bead 14. Encasement 16 includes an outer portion 22 (see FIGS. 1, 4, and 5) located around outer surface 20 of ferrite bead 14 and an inner portion 24 located within aperture 18 (see FIGS. 4–5). To facilitate installation of apparatus 10 upon cable 12, the length of inner portion 24 may have a tapered configuration. In other words, the general cross sectional area associated with a first opening 26 of apparatus 10 may be different than the corresponding cross sectional area associated with a second opening 28 of apparatus 10 as shown in FIG. 5. This longitudinal tapering enables a technician to quickly and easily insert cable 12 into apparatus 10 and thereafter slide apparatus 10 to an appropriate mounting location on cable 12. Accordingly, encasement 16 is preferably configured for press-fitting engagement with cable 12.

Encasement 16 may include a plurality of ribs 30 integrally formed with inner portion 24. As shown in FIGS. 1 and 3–5, ribs 30 are located within aperture 18 and are adjacent ferrite bead 14. Ribs 30 are preferably configured to removably secure encasement 16 to cable 12 by "pinching" cable 12 at the desired mounting position. To effectively secure apparatus 10 to cable 12, ribs 30 preferably extend along the entire length of aperture 18. Ribs 30 may protrude from ferrite bead 14 in a substantially radial direction relative to the longitudinal axis of ferrite bead 14 (as shown in FIGS. 3–4). The radial nature of ribs 30 functions to coaxially align cable 12 within aperture 18, which may be desirable to ensure that the electrical characteristics of ferrite bead 14 remain substantially consistent from installation to installation. It should be appreciated that apparatus 10 may alternately employ any structure for suitably securing encasement 16 to cable 12, and/or for coaxially aligning cable 12 within aperture 18, e.g, a number of integral tabs or bumps formed within aperture 18.

In summary, the present invention provides an improved ferrite bead apparatus for reducing electromagnetic interference associated with a cable. The ferrite bead apparatus includes an injection molded ferrite bead encasement that is coupled to the ferrite bead to form a one-piece assembly. The apparatus is inexpensive to manufacture and easy to install without the use of additional securing components or materials. Indeed, the preferred embodiment of the present invention may have a total manufacturing and installation cost of less than 80 cents per unit. Furthermore, the apparatus may be quickly and easily adjusted, removed, or reinstalled upon a cable without damaging the cable or the ferrite bead apparatus itself. In addition, the ferrite bead apparatus includes a molded encasement that protects the outer surface of the ferrite bead.

The present invention has been described above with reference to a preferred embodiment. However, those skilled in the art will recognize that changes and modifications may be made to the preferred embodiment without departing from the scope of the present invention. For example, the specific shape and size of the ferrite bead apparatus may vary from that shown and described herein. In addition, the configuration and composition of the resilient encasement may vary to suit the needs of the particular installation. These and other changes or modifications are intended to be included within the scope of the present invention, as expressed in the following claims.

What is claimed is:

1. An apparatus for reducing electromagnetic interference associated with a signal-conducting cable, said apparatus comprising:

a ferrite bead configured to surround a portion of said cable, said ferrite bead having a longitudinal aperture formed therein for receiving said cable;

an integral one-piece assembly comprising a one-piece encasement coupled to said ferrite bead, said encasement continuously covering an outer surface of said ferrite bead; and means for removably securing said encasement to said cable such that said ferrite bead surrounds said cable at a mounting location, said means for removably securing said encasement comprising a plurality of ribs located within said longitudinal aperture and adjacent said ferrite bead, at least one of said ribs extending along the length of said longitudinal aperture.

2. An apparatus according to claim 1, wherein said encasement is comprised of a resilient material and said encasement is molded around said ferrite bead.

3. An apparatus according to claim 1, wherein said encasement is comprised of a substantially burn-resistant material.

4. An apparatus according to claim 1, wherein said means for removably securing said encasement is integral to said encasement.

5. An apparatus for reducing electromagnetic interference associated with a signal-conducting cable, said apparatus comprising:

a ferrite bead having a longitudinal aperture configured to receive said cable; and a one-piece assembly comprising a resilient unhinged encasement coupled to said ferrite bead, said encasement comprising:

an outer portion located around an outer surface of said ferrite bead; and an inner portion located within said aperture, said inner portion having a length with a tapered configuration to facilitate installation of said apparatus onto said cable.

6. An apparatus according to claim 5, wherein said inner portion and said outer portion of said encasement is molded around said ferrite bead.

7. An apparatus according to claim 5, wherein said inner portion comprises means for removably securing said encasement to said cable such that said ferrite bead surrounds said cable at a mounting location.

8. An apparatus according to claim 7, wherein said means for removably securing said encasement comprises a plurality of ribs located within said longitudinal aperture and adjacent said ferrite bead, at least one of said ribs extending along the length of said longitudinal aperture.

9. An apparatus according to claim 8, wherein each of said ribs extend along the length of said longitudinal aperture.

10. An apparatus according to claim 8, wherein each of said ribs protrude from said ferrite bead in a substantially radial direction relative to a longitudinal axis of said ferrite bead.

11. An apparatus according to claim 7, wherein said means for removably securing said encasement is configured to coaxially align said cable within said longitudinal aperture.

12. An apparatus according to claim 5, wherein said inner portion is configured for press-fitting engagement with said cable.

13. An apparatus for reducing electromagnetic interference associated with a signal-conducting cable, said apparatus comprising:

a one-piece ferrite bead having a longitudinal aperture, said longitudinal aperture being configured to receive said cable;

a one-piece assembly comprising a substantially resilient unhinged encasement molded upon said ferrite bead; and means for coaxially aligning said cable within said longitudinal aperture, said means for coaxially aligning said cable being coupled to said encasement, wherein said means for coaxially aligning said cable comprises a plurality of ribs located within said longitudinal aperture and adjacent said ferrite bead, at least one of said ribs extending along the length of said longitudinal aperture.

14. An apparatus according to claim 13, wherein said means for coaxially aligning is integrally molded with said encasement.

15. An apparatus according to claim 13, wherein said encasement is comprised of a substantially burn-resistant material.

16. An apparatus according to claim 13, wherein said means for coaxially aligning said cable is further configured to removably secure said encasement to said cable such that said ferrite bead surrounds said cable at a mounting location.

17. An apparatus according to claim 13, wherein each of said ribs extend along the length of said longitudinal aperture.

18. An apparatus according to claim 13, wherein each of said ribs protrude from said ferrite bead in a substantially radial direction relative to a longitudinal axis of said ferrite bead.

* * * * *